United States Patent
Fukuoka et al.

(10) Patent No.: US 7,032,536 B2
(45) Date of Patent: Apr. 25, 2006

(54) THIN FILM FORMATION APPARATUS INCLUDING ENGAGEMENT MEMBERS FOR SUPPORT DURING THERMAL EXPANSION

(75) Inventors: Yusuke Fukuoka, Nara (JP); Yasushi Fujioka, Kyoto (JP); Katsushi Kishimoto, Kyoto (JP); Hiroyuki Fukuda, Nara (JP); Katsuhiko Nomoto, Kashiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 10/680,213

(22) Filed: Oct. 8, 2003

(65) Prior Publication Data
US 2004/0069230 A1  Apr. 15, 2004

(30) Foreign Application Priority Data
Oct. 11, 2002 (JP) ............................. 2002-299069

(51) Int. Cl.
*C23C 16/50* (2006.01)
(52) U.S. Cl. .................... 118/723 E; 118/725; 118/729
(58) Field of Classification Search ............ 118/723 E, 118/723 R, 725, 729
See application file for complete search history.

(56) References Cited

U.S. PATENT DOCUMENTS

| 4,264,393 | A | | 4/1981 | Gorin et al. | |
|---|---|---|---|---|---|
| 5,368,676 | A | * | 11/1994 | Nagaseki et al. | 156/345.38 |
| 5,487,786 | A | * | 1/1996 | Chida et al. | 118/723 E |
| 5,733,405 | A | * | 3/1998 | Taki et al. | 156/345.46 |
| 6,142,096 | A | * | 11/2000 | Sakai et al. | 118/723 E |
| 6,313,430 | B1 | * | 11/2001 | Fujioka et al. | 219/121.57 |
| 6,363,881 | B1 | * | 4/2002 | Murata et al. | 118/723 E |
| 6,422,172 | B1 | * | 7/2002 | Tanaka et al. | 118/723 R |
| 2002/0000201 | A1 | * | 1/2002 | Murata et al. | 118/723 E |

* cited by examiner

*Primary Examiner*—Bret Chen
(74) *Attorney, Agent, or Firm*—Nixon & Vanderhye P.C.

(57) ABSTRACT

A thin film formation apparatus for forming a thin film on a substrate is provided, which comprises: a reaction chamber; a gas introduction section for introducing a reactant gas into the reaction chamber; an evacuation section for exhausting the reactant gas from the reaction chamber; first and second planar electrodes provided in the reaction chamber; first and second support members which respectively support the first and second electrodes in parallel relation; a high frequency power source for applying high frequency power between the first and second electrodes; and a heating section for heating one of the first and second electrodes; wherein the substrate is placed on the heated electrode, and at least one of the first and second electrodes is supported movably in the direction of thermal expansion by the corresponding support member. With this arrangement, the variation in the spacing between the first electrode (anode electrode) and the second electrode (cathode electrode) can be reduced when the first and second electrodes are heated.

12 Claims, 8 Drawing Sheets

THIN FILM FORMATION APPARATUS INCLUDING ENGAGEMENT MEMBERS FOR SUPPORT DURING THERMAL EXPANSION

CROSS-REFERENCE TO RELATED APPLICATIONS

This application is related to Japanese application No.2002-299069 filed on Oct. 11, 2002, whose priority is claimed under 35 USC § 119, the disclosure of which is incorporated by reference in its entirety.

BACKGROUND OF THE INVENTION

1. Field of the Invention

The present invention relates to a thin film formation apparatus and a thin film formation method employing the apparatus. More particularly, the invention relates to a thin film formation apparatus and a thin film formation method which utilize a plasma CVD process.

2. Description of the Related Art

One known method for forming a silicon thin film on a substrate is a plasma CVD process in which a reactant gas is decomposed by a plasma energy and the resulting material is deposited on a substrate. Further, a plasma CVD apparatus is known to be employed for this process.

The plasma CVD apparatus typically includes a reaction chamber adapted to be evacuated to vacuum, a gas introduction section for introducing a reactant gas into the reaction chamber, an evacuation section for exhausting the reactant gas from the reaction chamber, a planar anode electrode and a planar cathode electrode disposed in opposed spaced relation, and a high frequency power source for applying high frequency power between the anode electrode and the cathode electrode (see, for example, U.S. Pat. No. 4,264,393).

The anode electrode has a surface on which a substrate to be formed with a film is placed in opposed relation to the cathode electrode, and includes a heater incorporated therein for heating the substrate. The cathode electrode has a hollow inside and a surface formed with a multiplicity of through-holes in opposed relation to the anode electrode, and is adapted to eject the gas supplied from the gas introduction section through the through-holes. The anode electrode and the cathode electrode are firmly fixed to the reaction chamber so that the spacing therebetween can accurately be maintained.

In the formation of a thin film by the plasma CVD apparatus, the anode electrode on which the substrate is placed is heated up to about 300° C., and the cathode electrode opposed to the anode electrode is also heated by heat radiation from the anode electrode. At this time, the anode electrode and the cathode electrode are thermally expanded to be deformed, so that the spacing therebetween is varied. If the spacing between the anode electrode and the cathode electrode is varied, the apparatus fails to provide desired performance, thereby adversely affecting a film thickness distribution.

SUMMARY OF THE INVENTION

In view of the foregoing, the present invention is directed to a thin film formation apparatus which is capable of preventing the thermal deformation of the anode electrode and the cathode electrode when the anode electrode and the cathode electrode are heated, and suppressing the variation in the spacing between the anode electrode and the cathode electrode.

According to the present invention, there is provided a thin film formation apparatus for forming a thin film on a substrate, which comprises: a reaction chamber; a gas introduction section for introducing a reactant gas into the reaction chamber; an evacuation section for exhausting the reactant gas from the reaction chamber; first and second planar electrodes provided in the reaction chamber; first and second support members which respectively support the first and second electrodes in parallel relation; a high frequency power source for applying high frequency power between the first and second electrodes; and a heating section for heating one of the first and second electrodes; wherein the substrate is placed on the heated electrode, and at least one of the first and second electrodes is supported movably in the direction of thermal expansion by the corresponding support member.

In the inventive thin film formation apparatus, the first and second support members respectively support the first and second electrodes, and at least one of the first and second electrodes is movable in the thermal expansion direction. Therefore, when the first and second electrodes are heated to be thermally expanded, the at least one electrode moves in the thermal expansion direction, whereby the thermal expansion can be relieved. As a result, a variation in the spacing between the first and second electrodes can be reduced, thereby improving the performance of the apparatus. Since the at least one of the first and second electrodes is supported movably in the thermal expansion direction, the electrodes can easily be removed from the apparatus in the maintenance of the apparatus. This facilitates the maintenance of the plasma CVD apparatus.

DESCRIPTION OF THE PREFERRED EMBODIMENTS

A thin film formation apparatus for forming a thin film on a substrate, according to the present invention comprises: a reaction chamber; a gas introduction section for introducing a reactant gas into the reaction chamber; an evacuation section for exhausting the reactant gas from the reaction chamber; first and second planar electrodes provided in the reaction chamber; first and second support members which respectively support the first and second electrodes in parallel relation; a high frequency power source for applying high frequency power between the first and second electrodes; and a heating section for heating one of the first and second electrodes; wherein the substrate is placed on the heated electrode, and at least one of the first and second electrodes is supported movably in the direction of thermal expansion by the corresponding support member.

The inventive thin film formation apparatus is employed, for example, for formation of a silicon thin film by a plasma CVD process. Examples of the silicon thin film include crystalline to amorphous thin films essentially comprising silicon. The reactant gas comprises a silicon containing gas. Specific examples of the reactant gas include silane ($SiH_4$) and disilane ($Si_2H_6$), which may be diluted by hydrogen ($H_2$) or helium (He).

Examples of the silicon thin film to be formed by the inventive thin film formation apparatus include a silicon carbide (SiC) film, a silicon nitride (SiN) film, a silicon oxide (SiO) film and a SiGe film. For the formation of the silicon carbide film, the reactant gas further comprises a carbon containing gas such as $CH_4$ or $C_2H_6$, which is introduced together with the silicon containing gas. For the formation of the silicon nitride film, the reactant gas further comprises a nitrogen containing gas such as $NH_3$ or NO, which is introduced together with the silicon containing gas. For the formation of the silicon oxide film, the reactant gas further comprises an oxygen containing gas such as NO or $CO_2$, which is introduced together with the silicon containing gas. For the formation of the SiGe film, the reactant gas further comprises a germanium containing gas such as $GeH_4$, which is introduced together with the silicon containing gas. The reactant gas may further comprise a gas containing an impurity such as $PH_3$ for an n-type impurity or $B_2H_6$ for a p-type impurity, which is introduced for controlling the electrical conductivity of the silicon thin film.

In the inventive thin film formation apparatus, the reaction chamber is at least adapted to be evacuated to vacuum. The reaction chamber may be composed, for example, of a stainless steel, an aluminum alloy or the like. Where the reaction chamber is constituted by two or more components, the reaction chamber preferably has a perfectly sealable structure with an O-ring and the like fitted between the components.

In the inventive thin film formation apparatus, the gas introduction section is not particularly limited. A gas introducing device typically employed in the conventional plasma CVD apparatus, for example, may be employed.

In the inventive thin film formation apparatus, the evacuation section may comprise, for example, a vacuum pump, an evacuation pipe connected between the reaction chamber and the vacuum pump, and a pressure controller provided in the evacuation pipe.

In the inventive thin film formation apparatus, the high frequency power source may comprise, for example, a plasma excitation power source and an impedance matching device.

In the inventive thin film formation apparatus, the heating section is provided for heating the electrode on which the substrate is placed. The heating section may comprise, for example, a sheath heater, which may be incorporated in the first or second electrode.

In the inventive thin film formation apparatus, the first and second electrodes may be planar electrodes which are each composed of a heat-resistant and electrically-conductive material such as a stainless steel, an aluminum alloy or carbon.

The first electrode may be, for example, an anode electrode having a heater incorporated therein. The second electrode may be, for example, a cathode electrode having a hollow inside and a surface formed with a multiplicity of through-holes in opposed relation to the first electrode.

In the inventive thin film formation apparatus, the at least one of the first and second electrodes may partly be fixed to the corresponding support member.

In the inventive thin film formation apparatus, a portion of the at least one of the first and second electrodes is fixed to the corresponding support member, and the other portion of the at least one electrode is preferably supported movably in the thermal expansion direction by the corresponding support member.

With this arrangement, the position of the at least one of the first and second electrodes with respect to the corresponding support member is naturally determined, so that the at least one electrode can easily be positioned. The at least one electrode is only partly fixed to the support member and, hence, is freely movable in the thermal expansion direction during the heating.

The at least one of the first and second electrodes is fixed to the corresponding support member, for example, by a screw. Alternatively, the at least one electrode and the corresponding support member may be formed with a through-hole and a boss (projection), respectively. In this case, the boss of the support member is fitted in the through-hole of the electrode.

In the inventive thin film formation apparatus, the first and second electrodes may be supported horizontally and perpendicularly to the direction of gravity by the first and second support members. In this case, the first and second support members may each include a plurality of engagement members which are loosely engaged with the periphery of the corresponding electrode, and the engagement members may each include an engagement piece spaced horizontally from the periphery of the electrode, and a support piece which supports a lower surface of the electrode.

Where the first and second electrodes are generally rectangular, for example, the first and second support members may each include four engagement members which support four corners of the corresponding electrode. Where the first and second support members each include the four engagement members, the four engagement members of the second support member may respectively be fixed to upper ends of four support posts extending vertically from the bottom of the reaction chamber.

The shape and configuration of the first and second support members are not limited to those described above. For example, two frames may be provided as the first and second support members, and adapted to respectively support only the peripheral portions of the first and second electrodes. Further, the two frames may be combined in vertically stacked relation.

Thus, the shape and configuration of the first and second support members are not particularly limited, as long as the first and second electrodes can horizontally be supported and the at least one of the first and second electrodes can be supported movably in the thermal expansion direction.

In the inventive thin film formation apparatus, the first and second support members may be composed of an insulative material. Examples of the insulative material for the first and second support members include heat resistant materials such as glass, alumina and zirconia, which are excellent in electrically and thermally insulative properties.

Where the first and second support members are composed of any of these heat resistant materials, the first and second electrodes can electrically be isolated from the reaction chamber, and heat conduction to the reaction chamber can be minimized when the first and second electrodes are heated. As a result, a cooling device such as a cooling water pipe can be obviated, which is provided around the reaction chamber for cooling the reaction chamber in the conventional plasma CVD apparatus.

According to another aspect of the present invention, there is provided a thin film formation apparatus for forming thin films on substrates respectively, which comprises: a reaction chamber; a gas introduction section for introducing a reactant gas into the reaction chamber; an evacuation section for exhausting the reactant gas from the reaction chamber; plural pairs of first and second planar electrodes provided in the reaction chamber; first and second support members which respectively support the first and second electrodes in each of the pairs in parallel relation; a high frequency power source for applying high frequency power between the first and second electrodes in each of the pairs; and a heating section for heating one of the first and second electrodes in each of the pairs; wherein each substrate is placed on the heated electrode in each of pairs, and at least one of the first and second electrodes in each of the pairs is supported movably in the direction of thermal expansion by the corresponding support member.

In the thin film formation apparatus including the plural pairs of first and second electrodes, at least one of the first and second electrodes in each of the pairs may partly be fixed to the corresponding support member.

In the thin film formation apparatus including the plural pairs of first and second electrodes, a portion of at least one of the first and second electrodes in each of the pairs may be fixed to the corresponding support member, and the other portion of the at least one electrode may be supported movably in the thermal expansion direction by the corresponding support member.

In the thin film formation apparatus including the plural pairs of first and second electrodes, the plural pairs of the first and second electrodes may be supported horizontally and perpendicularly to a gravity direction by the first and second support members.

According to further another aspect of the present invention, there is provided a thin film formation method which employs the thin film formation apparatus including one pair of first and second electrodes for forming a thin film on a substrate, the method comprising the steps of: placing the substrate on the heated electrode; supplying a reactant gas into the reaction chamber; and applying high frequency power between the first and second electrodes.

According to still another aspect of the present invention, there is provided a thin film formation method which employs the thin film formation apparatus including plural pairs of first and second electrodes for forming thin films on substrates respectively, the method comprising the steps of: placing each substrate on the heated electrode in each of the pairs; supplying a reactant gas into the reaction chamber; applying high frequency power between the first and second electrodes in each of the pairs.

Thin film formation apparatuses according to embodiments of the present invention will hereinafter be described in detail with reference to the attached drawings. In the following embodiments, like components are denoted by like reference characters.

First Embodiment

Figure 1:
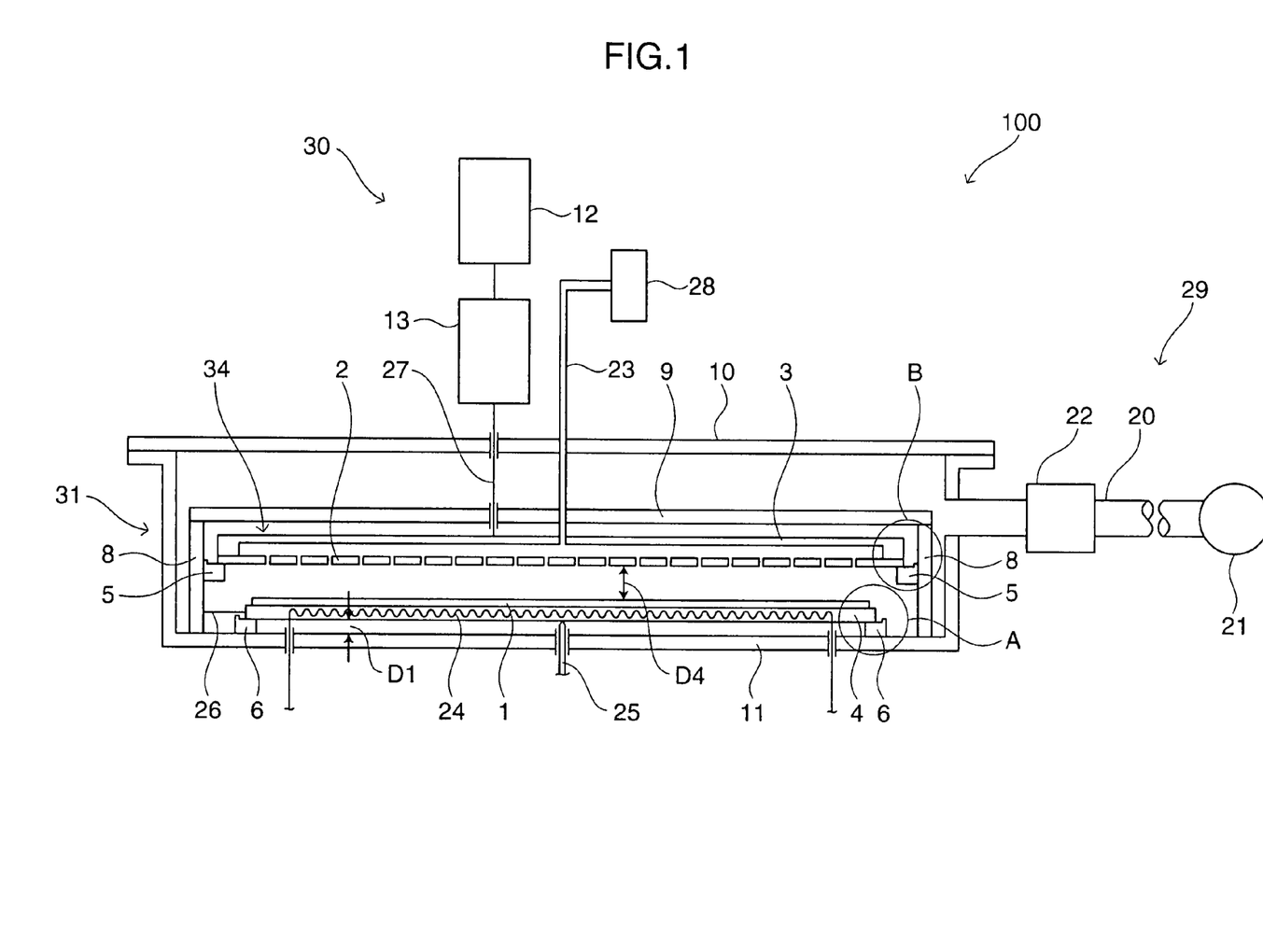
FIG. 1 is an explanatory diagram illustrating the overall construction of a thin film formation apparatus according to a first embodiment of the present invention.
Figure 2:
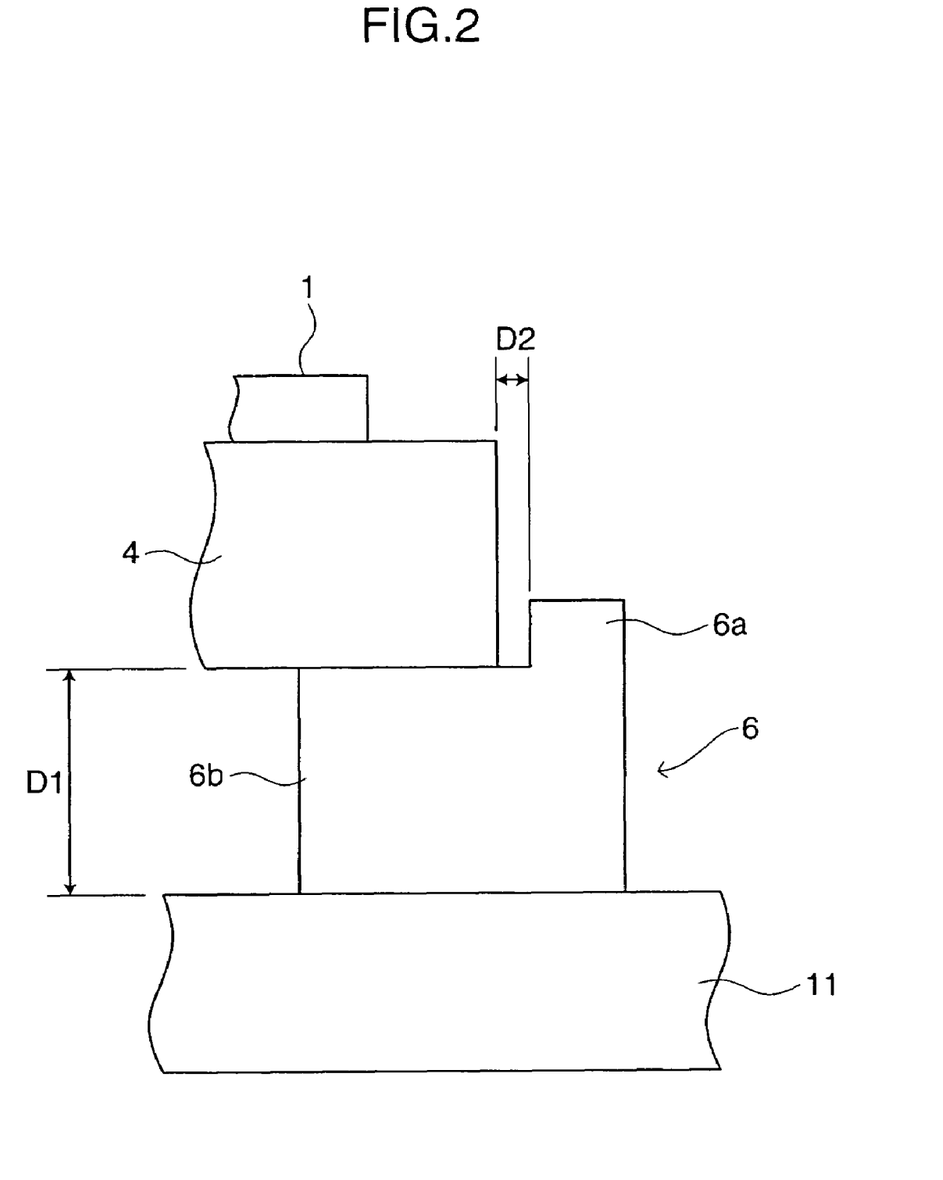
FIG. 2 is an enlarged diagram illustrating a portion of the apparatus indicated by a reference character A in FIG. 1.
Figure 3:
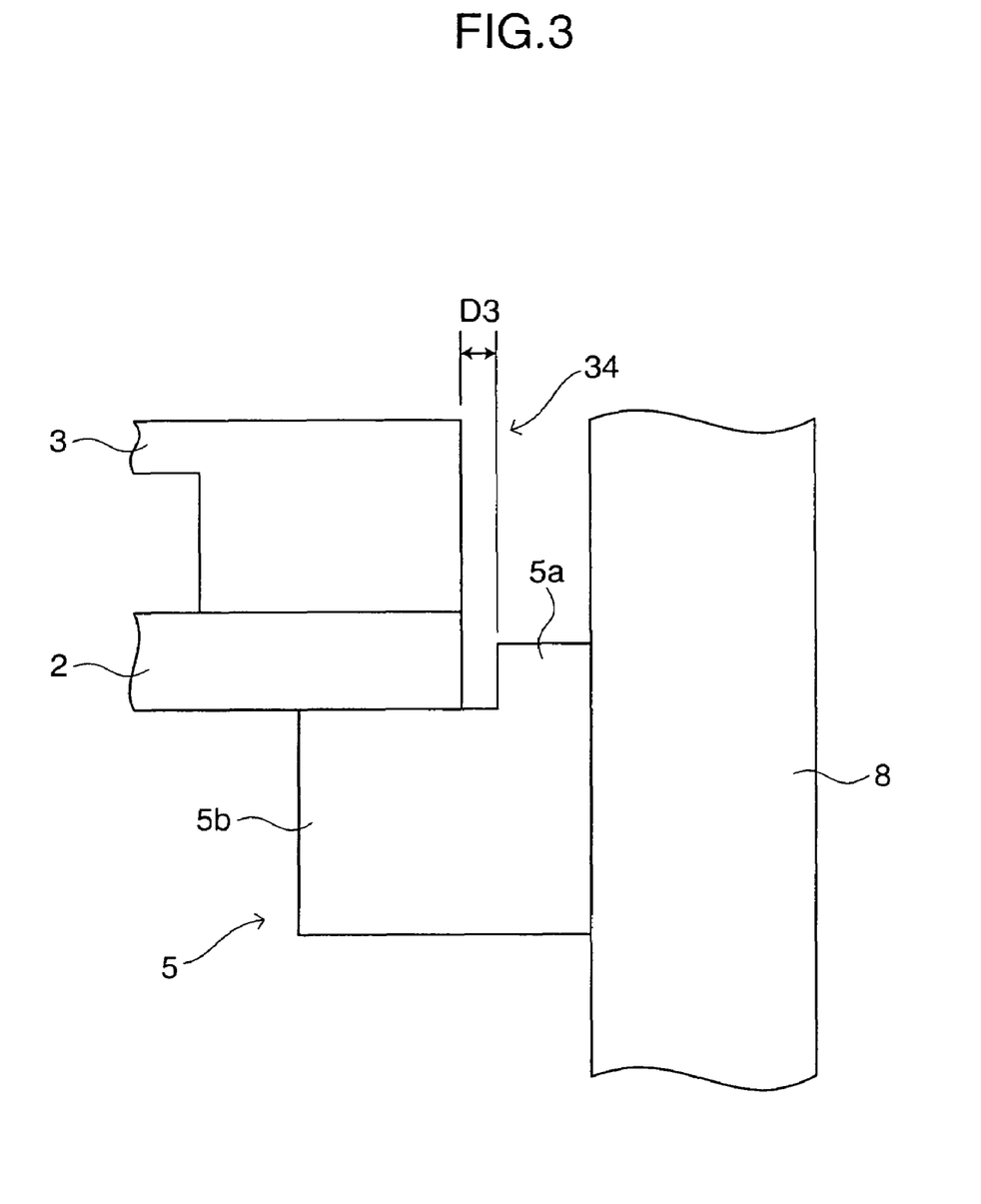
FIG. 3 is an enlarged diagram illustrating a portion of the apparatus indicated by a reference character B in FIG. 1.
Figure 4:
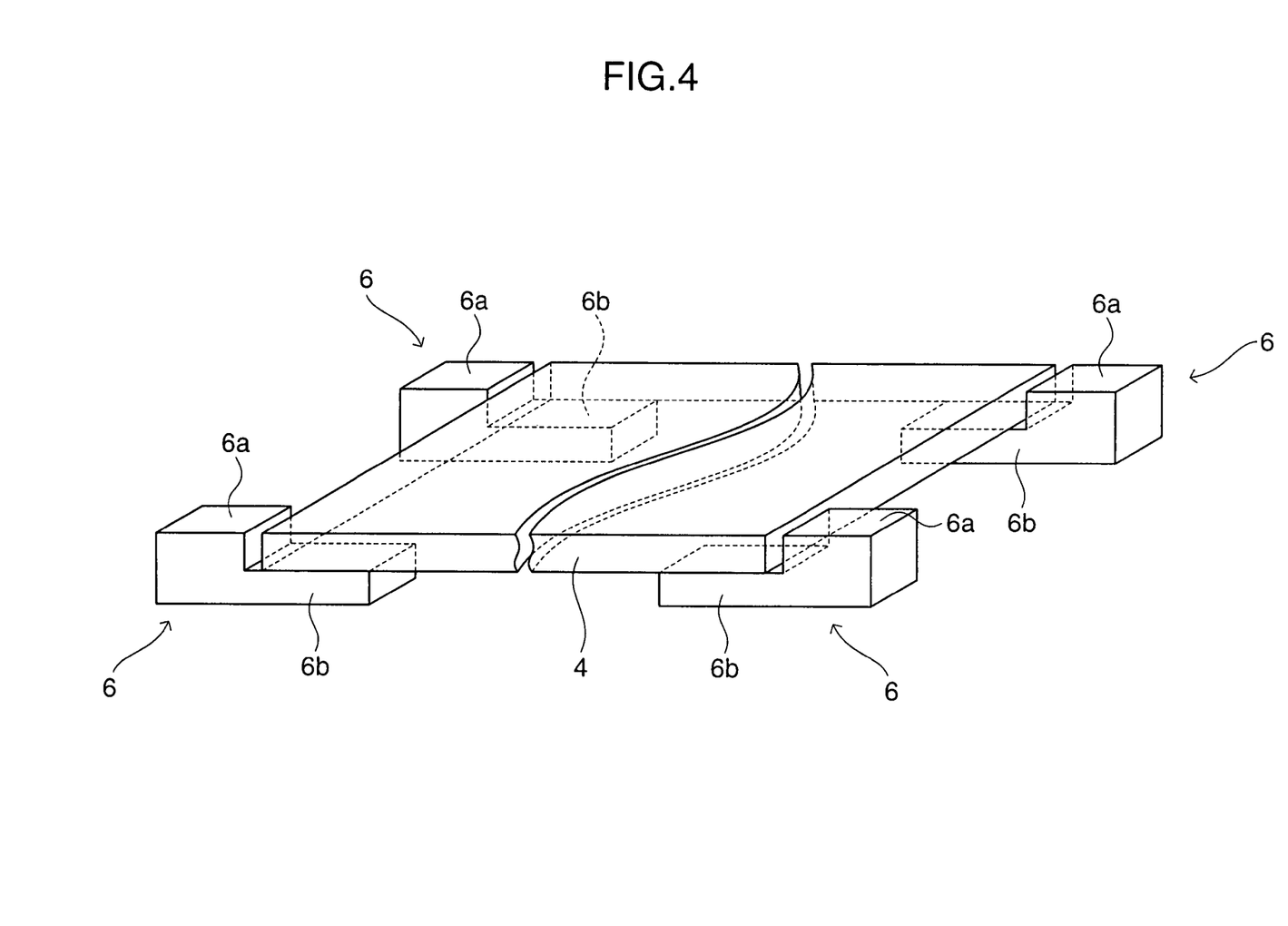
FIG. 4 is a diagram for explaining how to support an anode electrode in the first embodiment.
Figure 5:
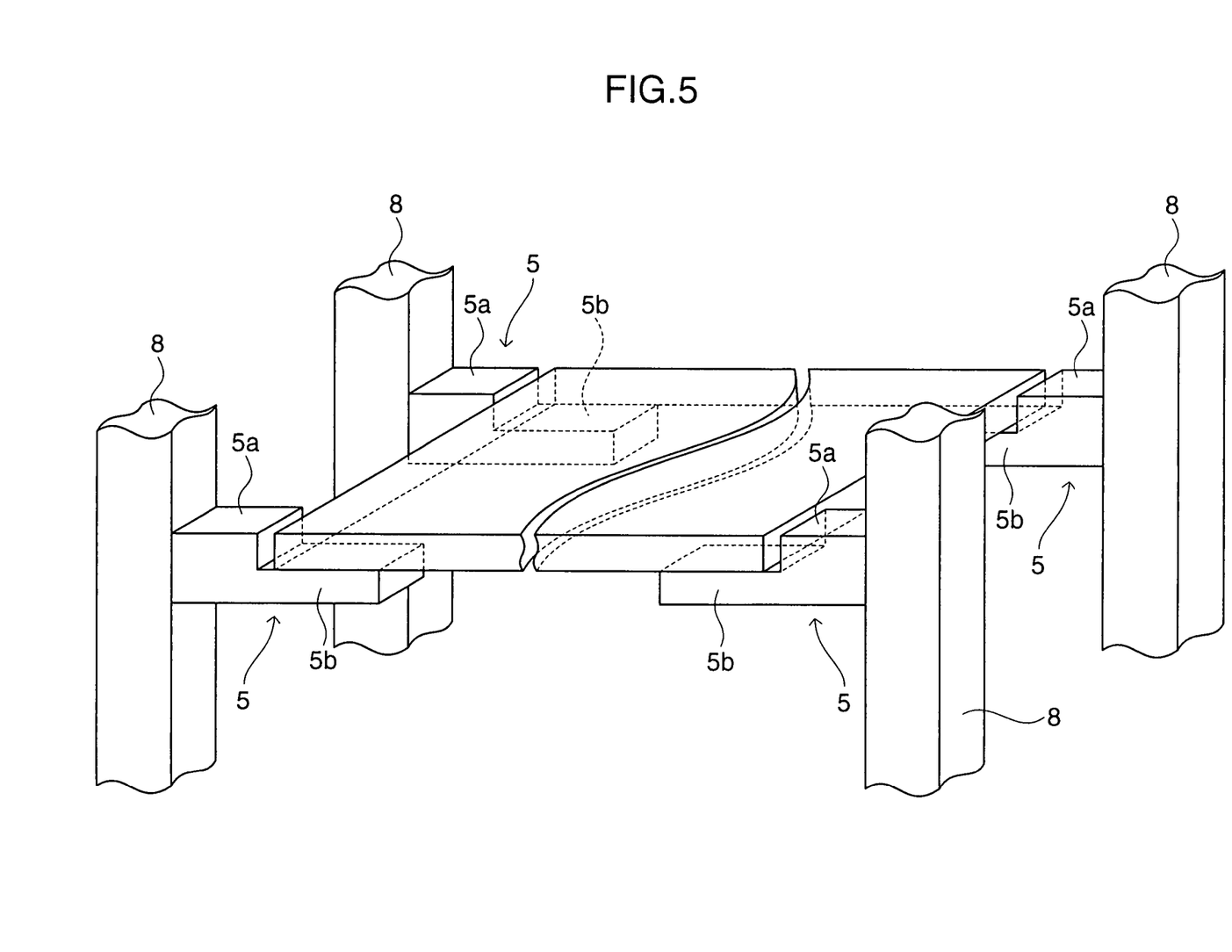
FIG. 5 is a diagram for explaining how to support a cathode electrode in the first embodiment.

A thin film formation apparatus according to a first embodiment of the present invention will be described with reference to FIGS. 1 to 5. FIG. 1 is an explanatory diagram illustrating the overall construction of the thin film formation apparatus according to the first embodiment of the present invention. FIG. 2 is an enlarged diagram illustrating a portion of the apparatus indicated by a reference character A in FIG. 1, and FIG. 3 is an enlarged diagram illustrating a portion of the apparatus indicated by a reference character B in FIG. 1. FIG. 4 is a diagram for explaining how to support an anode electrode, and FIG. 5 is a diagram for explaining how to support a cathode electrode.

As shown in FIG. 1, the thin film formation apparatus 100 according to the first embodiment includes a chamber (reaction chamber) 31, a gas introduction section 28 for introducing a reactant gas into the chamber 31, an evacuation section 29 for exhausting the reactant gas from the chamber 31, a planar anode electrode (first electrode) 4 and a planar cathode electrode (second electrode) 34 provided in the chamber 31, engagement members 6, 5 which respectively support the anode electrode 4 and the cathode electrode 34 in parallel relation, a high frequency power source 30 for applying high frequency power between the anode electrode 4 and the cathode electrode 34, and a sheath heater (heating section) 24 for heating the anode electrode 4. A substrate 1 to be formed with a film is placed on the anode electrode 4, and the anode electrode 4 and the cathode electrode 34 are supported movably in the direction of thermal expansion.

The chamber 31 includes a main body 11 and a cover 10, which are each composed of a stainless steel, an aluminum alloy or the like. The cover 10 is fitted on the main body 11 with the intervention of an O-ring (not shown) or the like for sealing the chamber 31.

The evacuation section 29, which includes an evacuation pipe 20, a pressure controller 22 and a vacuum pump 21, is connected to the chamber 31, so that the degree of the vacuum in the chamber 31 can be controlled at any desired level.

As shown in FIGS. 1 and 4, the engagement member 6 includes four engagement members, which are provided on the bottom of the chamber 31 and respectively support the four corners of the anode electrode 4 thereon. The four engagement members 6 constitute the first support member.

The anode electrode 4 is properly dimensioned according to the size of the substrate 1. In the first embodiment, the substrate 1 has a size of 900 mm×550 mm to 1200 mm×750 mm. For this substrate, the anode electrode 4 has a size of 1000 mm×600 mm to 1200 mm×800 mm.

The anode electrode 4 may be composed of a stainless steel, an aluminum alloy, carbon or the like. In the first embodiment, the anode electrode 4 is composed of the aluminum alloy. The anode electrode 4 includes a sheath heater 24 incorporated therein. The temperature of the sheath heater 24 is controlled within the range between a room temperature and 600° C. with the use of a temperature sensor of enclosed type such as a thermocouple 25.

For suppression of temperature increase of the chamber 31 due to heat radiation from the anode electrode 4, the anode electrode 4 is spaced from the chamber 31 by a distance D1 of 10 mm to 30 mm, as measured from the bottom of the chamber 31 to the lower surface of the anode electrode 4, by means of the engagement members 6. For suppression of temperature increase of the chamber 31 due to heat conduction from the anode electrode 4, it is desirable that the engagement members 6 are each composed of a material, such as glass, alumina or zirconia, having a smaller heat conductivity. In the first embodiment, the engagement members 6 are each composed of zirconia.

For the same reason, it is desirable that the anode electrode 4 has a smaller area in contact with the engagement members 6. In the first embodiment, the four engagement members 6 support only the four corners of the anode electrode 4 as described above. Surfaces of the engagement members 6 in contact with the anode electrode 4 each have an area of 30 mm×50 mm. The anode supporting method and the contact area are determined so as not to allow the anode electrode 4 to warp. For further suppression of the heat conduction from the anode electrode 4 to the chamber 31, the surfaces of the engagement members 6 in contact with the anode electrode 4 are each formed with several recesses having a depth of 1 mm to 5 mm. Thus, the contact areas of the engagement members 6 can be reduced without reducing the strength of the engagement members 6.

As best shown in FIGS. 2 and 4, the engagement members 6 each include a support piece 6*b* which supports the lower surface of the anode electrode 4, and an engagement piece 6*a* which is horizontally spaced from the periphery of the anode electrode 4 supported on the support piece 6*b*. In consideration of the thermal expansion of the anode electrode 4 due to the heating, the engagement pieces 6*a* are dimensioned and positioned so as to be properly spaced from the periphery of the anode electrode 4. In the first embodiment, the engagement pieces 6*a* are spaced a distance D2 of 5 mm from the periphery of the anode electrode 4 at a room temperature before the thermal expansion of the anode electrode 4.

The anode electrode 4 is merely placed on the four engagement members 6 but not fixed by a screw or the like. Even if the anode electrode 4 is heated to be thermally expanded, the anode electrode 4 moves (slides) on the support pieces 6*b* of the engagement members 6 correspondingly to the thermal expansion. Thus, the thermal expansion is relieved.

The anode electrode 4 is electrically connected to the chamber 31 via ground lines 26. The ground lines 26 each comprise an aluminum plate having a width of 10 mm to 35 mm and a thickness of 0.5 mm to 3 mm, and are fixed to the four corners of the anode electrode 4.

The cathode electrode 34 includes a shower plate 2 and a rear plate 3, which are each composed of a stainless steel, an aluminum alloy or the like. In the first embodiment, the shower plate 2 and the rear plate 3 are each composed of the aluminum alloy. The cathode electrode 34 is properly dimensioned according to the size of the substrate 1. In the first embodiment, the cathode electrode 34 has a size of 1000 mm×600 mm to 1200 mm×800 mm. The cathode electrode 34 has a hollow inside, and is connected to the gas introduction section 28 via a reactant gas pipe 23. The reactant gas introduced into the cathode electrode 34 from the gas introduction section 28 via the reactant gas pipe 23 is ejected in a shower-like form from a plurality of through-holes formed in the shower plate 2 of the cathode electrode 34.

The through-holes of the shower plate 2 preferably each have a diameter of 0.1 mm to 2.0 mm, and are arranged at a pitch of several millimeters to several centimeters.

As shown in FIGS. 1 and 5, the engagement member 5 includes four engagement members which respectively support the four corners of the cathode electrode 34 thereon. The four engagement members 5 constitute the second support member. The engagement members 5 are respectively fixed to four support posts 8 each vertically extending from the bottom of the chamber 31 in the vicinity of upper ends of the support posts 8. A top plate 9 is fixed to the upper ends of the four support posts 8 for reinforcement of the support posts 8.

The engagement members 5 constituting the second support member may each be composed of glass, alumina, zirconia or the like. In the first embodiment, the engagement members 5 are each composed of alumina or zirconia. The top plate 9 may be composed of a stainless steel, an aluminum alloy or the like. In the first embodiment, the top plate 9 is composed of the aluminum alloy.

The cathode electrode 34 is also heated due to heat radiation from the anode electrode 4. As in the case of the engagement members 6, it is desirable that the cathode electrode 34 has the smallest possible area in contact with the engagement members 5. In the first embodiment, surfaces of the engagement members 5 in contact with the cathode electrode 34 each have an area of 100 mm×50 mm. As in the case of the engagement members 6, the contact areas of the engagement members 5 are determined so as not to allow the cathode electrode 34 to warp.

As best shown in FIGS. 3 and 5, the engagement members 5 each include a support piece 5*b* which supports the lower surface of the cathode electrode 34, and an engagement piece 5*a* horizontally spaced from the periphery of the cathode electrode 34 supported on the support piece 5*b*. In consideration of the thermal expansion of the cathode electrode 34 heated by heat radiation from the anode electrode 4, the engagement pieces 5*a* are dimensioned and positioned so as to be properly spaced from the periphery of the cathode electrode 34. In the first embodiment, the engagement pieces 5*a* are spaced a distance D3 of 5 mm from the periphery of the cathode electrode 34 at a room temperature before the thermal expansion of the cathode electrode 34.

The cathode electrode 34 is merely placed on the four engagement members 5 but not fixed by a screw or the like. Even if the cathode electrode 34 is heated to be thermally expanded, the cathode electrode 34 moves (slides) on the support pieces 5*b* of the engagement members 5 correspondingly to the thermal expansion. Thus, the thermal expansion is relieved.

In the first embodiment, the anode electrode 4 and the cathode electrode 34 are each movable in the thermal expansion directions. Therefore, the anode electrode 4 and the cathode electrode 34 slide on the support pieces 6*b*, 5*b* of the engagement members 6, 5, whereby the thermal expansion thereof is relieved. Hence, the spacing between the anode electrode 4 and the cathode electrode 34 can be maintained within a designed spacing tolerance with no variation. The anode electrode 4 and the cathode electrode 34 can easily be removed from the apparatus in the maintenance of the apparatus, because the anode electrode 4 and the cathode electrode 34 are not fixed by screws or the like as described above. This facilitates the maintenance of the apparatus.

The spacing D4 between the anode electrode 4 and the cathode electrode 34 is typically several millimeters to several tens millimeters. In the first embodiment, the spacing D4 is 2 mm to 30 mm. The tolerance of the spacing between the anode electrode 4 and the cathode electrode 34 (spacing tolerance) is preferably several percent of a predetermined value. In the first embodiment, the spacing tolerance is within 1%.

The high frequency power source 30, which includes a plasma excitation power source 12 and an impedance matching device 13, is connected to the cathode electrode 34 via a power inlet terminal 27, so that high frequency power is applied to the cathode electrode 34. The plasma excitation power source 12 typically employs a power output of 10 W to 100 KW at a frequency of DC to 108.48 MHz. In the first embodiment, the plasma excitation power source 12 employs a power output of 10 W to 100 KW at a frequency of 13.56 MHz to 54.24 MHz.

In the thin film formation apparatus 100 having the aforesaid construction according to the first embodiment, the reactant gas, which contains $SiH_4$ diluted by $H_2$, is introduced into the chamber 31 at a predetermined flow rate at a predetermined pressure through the cathode electrode 34, and the high frequency power is applied between the cathode electrode 34 and the anode electrode 4 to cause glow discharge. In this state, silicon is deposited on the substrate 1 for ten minutes, whereby a silicon thin film having a thickness of 300 nm is formed on the substrate 1 with a film thickness variation of ±10%.

Second Embodiment

Figure 6:
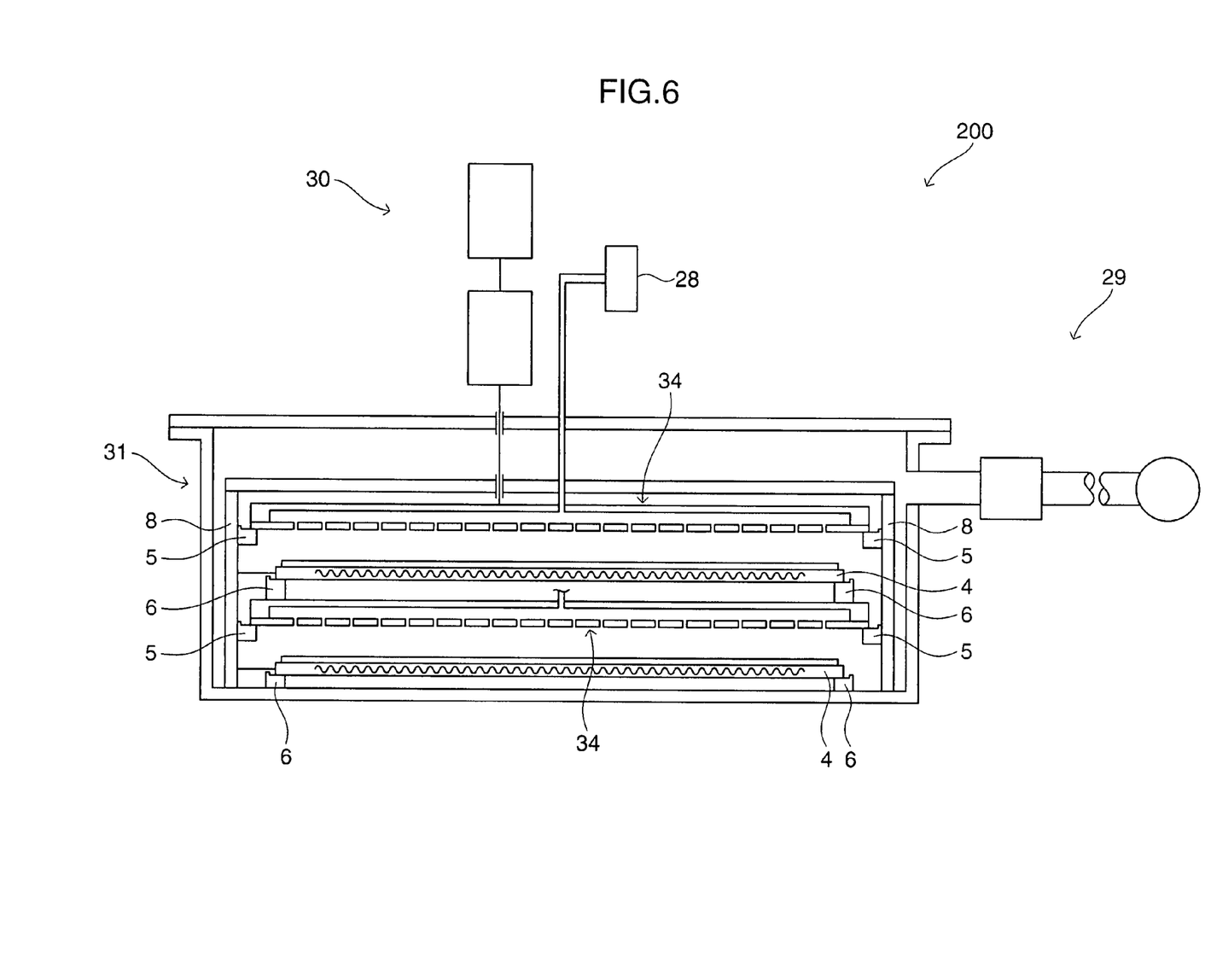
FIG. 6 is a diagram illustrating the overall construction of a thin film formation apparatus according to a second embodiment of the present invention.

A thin film formation apparatus according to a second embodiment will be described with reference to FIG. 6. The thin film formation apparatus 200 according to the second embodiment has a two stage structure which includes two sets of anode electrodes 4 and cathode electrodes 34, and two sets of engagement members 5 and engagement members 6. More specifically, the engagement members 6 for supporting the anode electrode 4 of the second stage are provided on the cathode electrode 34 of the first stage. Thus, the two sets of anode electrodes 4 and cathode electrodes 34 are stacked vertically.

Support posts 8 supports the engagement members 5 of the first and second stages. Although the second embodiment provides the two stage structure, a three or more stage structure may be provided by repeating the aforesaid structure. In the second embodiment, the chamber 0.31, the gas introduction section 28, the evacuation section 29, the high frequency power source 30, the anode electrodes 4, the cathode electrodes 34, the engagement members 6 (first support member) and the engagement members 5 (second support member) respectively have the same constructions as those in the first embodiment.

Third Embodiment

Figure 7:
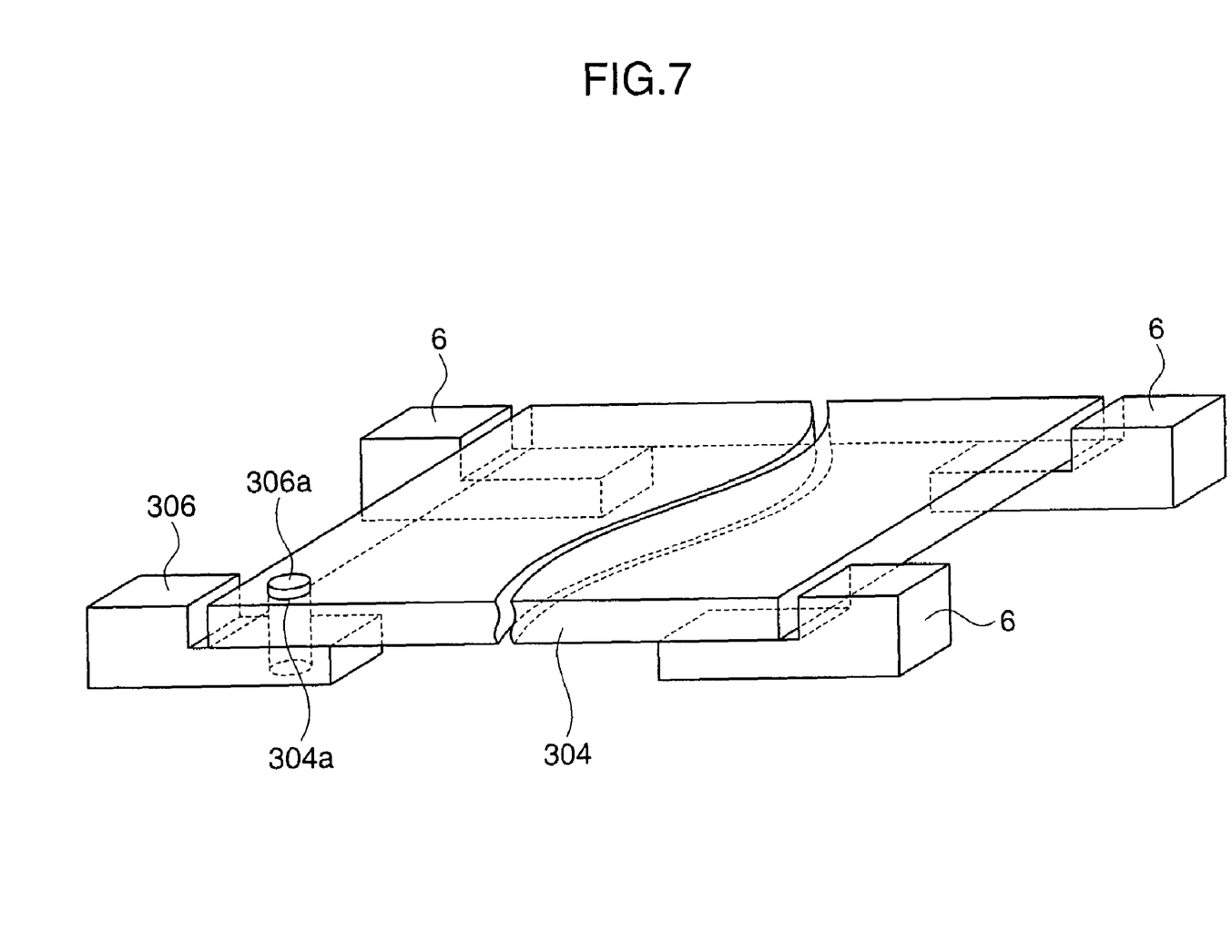
FIG. 7 is a diagram for explaining how to support an anode electrode in a third embodiment.

A thin film formation apparatus according to a third embodiment will be described with reference to FIGS. 7 and 8. FIG. 7 is a diagram for explaining how to support an anode electrode in the third embodiment, and FIG. 8 is a diagram for explaining how to support a cathode electrode in the third embodiment.

Figure 8:
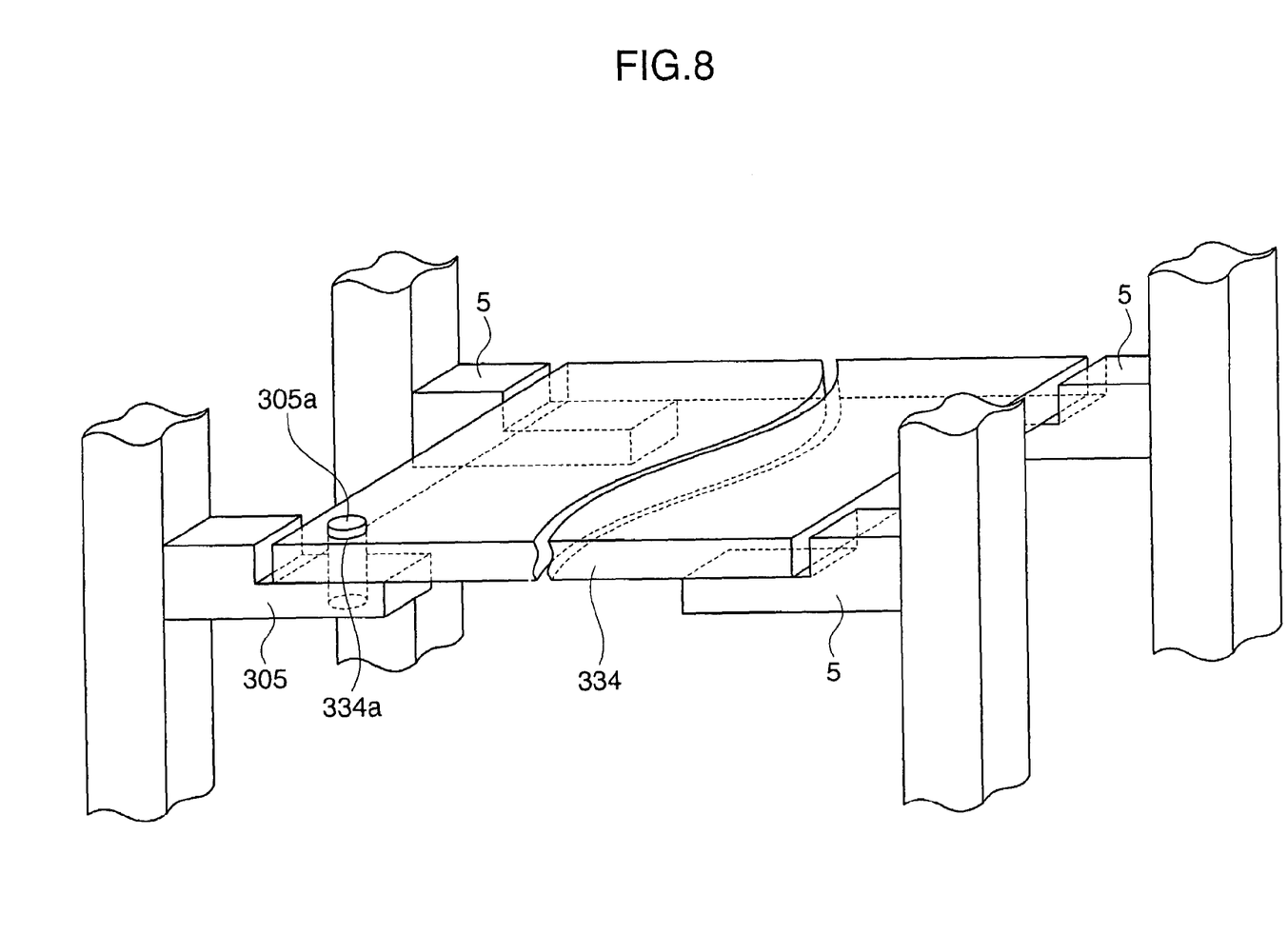
FIG. 8 is a diagram for explaining how to support a cathode electrode in the third embodiment.

As shown in FIGS. 7 and 8, one of the four corners of the anode electrode 304 is fixed at a single point by a engagement member 306, and one of the four corners of the cathode 334 is fixed at a single point by a engagement member 305 in the third embodiment. The other three corners of each of the anode electrode 304 and the cathode electrode 334 are supported on corresponding engagement members 6, 5 movably in thermal expansion directions as in the first embodiment.

Cylindrical bosses 306a and 305a are provided upright on the engagement members 306 and 305, respectively. A hole 304a is formed in the one of the corners of the anode electrode 304 in association with the boss 306a, and a hole 334a is formed in the one of the corners of the cathode electrode 334 in association with the boss 305a.

The bosses 306a and 305a of the engagement members 306 and 305 are respectively fitted in the holes 304a and 334a of the anode electrode 304 and the cathode electrode 334, whereby the anode electrode 304 and the cathode electrode 334 are detachably fixed to the engagement members 306 and 305, respectively.

Therefore, when the anode electrode 304 is placed on the engagement member 306 and the engagement members 6 and the cathode electrode 334 is placed on the engagement member 305 and the engagement members 5, the positions of the anode electrode 304 and the cathode electrode 334 are naturally determined by the engagement members 306, 305, respectively, so that the anode electrode 304 and the cathode electrode 334 can easily be positioned. Since the anode electrode 304 and the cathode electrode 334 are each fixed at one corner thereof to the engagement member 306, 305, the other three corners thereof are freely movable in the thermal expansion direction.

Therefore, even if the anode electrode 304 and the cathode electrode 334 are heated to be expanded, the spacing between the anode electrode 304 and the cathode electrode 334 can accurately be maintained as in the first embodiment.

The engagement members 306, 305 may be composed of the same material as the engagement members 6, 5. The thin film formation apparatus according to the third embodiment has substantially the same construction as that of the first embodiment except for the aforesaid point. Though not shown, the thin film formation apparatus according to the third embodiment may be modified as having a multi-stage structure which includes plural pairs of anode electrodes and cathode electrodes stacked in a single chamber and plural sets of engagement members as in the second embodiment.

In accordance with the present invention, the first and second support members support the first and second electrodes in parallel relation, and at least one of the first and second electrodes is movable in the thermal expansion direction. Therefore, when the first and second electrodes are heated to be thermally expanded, the at least one electrode moves in the thermal expansion direction, whereby the thermal expansion can be relieved. As a result, the variation in the spacing between the first and second electrodes is reduced, so that the performance of the apparatus is improved.

What is claimed is:

1. A thin film formation apparatus for forming a thin film on a substrate, comprising:
    a reaction chamber;
    a gas introduction section for introducing a reactant gas into the reaction chamber;
    an evacuation section for exhausting the reactant gas from the reaction chamber;
    first and second planar electrodes provided in the reaction chamber;
    first and second support members which respectively support the first and second electrodes in parallel relation;
    a high frequency power source for applying high frequency power between the first and second electrodes; and
    a heating section for heating one of the first and second electrodes;
    wherein the substrate is placed on the heated electrode, and
    wherein at least one of the first and second electrodes is supported movably in a lateral direction of thermal expansion by the corresponding support member, and wherein said corresponding support member has a protruding stop portion that does not engage said one electrode at room temperature thereby permitting said one electrode to expand laterally toward the stop portion at high temperatures so as to allow for thermal expansion of said one electrode.

2. A thin film formation apparatus as set forth in claim 1, wherein the at least one of the first and second electrodes is partly fixed to the corresponding support member.

3. A thin film formation apparatus as set forth in claim 1, wherein a portion of the at least one of the first and second electrodes is fixed to the corresponding support member, and the other portion of the at least one electrode is supported movably in the thermal expansion direction by the corresponding support member.

4. A thin film formation apparatus as set forth in claim 1, wherein the first and second electrodes are supported horizontally and perpendicularly to a gravity direction by the first and second support members.

5. A thin film formation apparatus as set forth in claim 4, wherein the first and second support members each include a plurality of engagement or stop members which are spaced apart from the corresponding electrode at room temperature but which may engage the corresponding electrode after thermal expansion thereof.

6. A thin film formation apparatus as set forth in claim 4, wherein the first and second electrodes are generally rectangular, the first and second support members each including four engagement members which support four corners of the corresponding electrode.

7. A thin film formation apparatus as set forth in claim 1, wherein the first and second support members are each composed of an insulative material.

8. A thin film formation apparatus as set forth in claim 7, wherein the insulative material is one of glass, alumina and zirconia.

9. A thin film formation apparatus for forming thin films on substrates respectively, comprising:
   a reaction chamber;
   a gas introduction section for introducing a reactant gas into the reaction chamber;
   an evacuation section for exhausting the reactant gas from the reaction chamber;
   plural pairs of first and second planar electrodes provided in the reaction chamber;
   first and second support members which respectively support the first and second electrodes in each of the pairs in parallel relation;
   a high frequency power source for applying high frequency power between the first and second electrodes in each of the pairs; and
   a heating section for heating at least one of the first and second electrodes in each of the pairs;
   wherein each substrate is placed on the heated electrode in each of the pairs, and wherein the heated electrode is supported by the first support member, said first support member comprising first and second protruding stop portions that do not engage the heated electrode at room temperature but can engage the first electrode at elevated temperatures thereby permitting the heated electrode to expand laterally toward the stop portions when heated so as to allow for thermal expansion thereof.

10. A thin film formation apparatus as set forth in claim 9, wherein at least one of the first and second electrodes in each of the pairs is partly fixed to the corresponding support member.

11. A thin film formation apparatus as set forth in claim 9, wherein a portion of at least one of the first and second electrodes in each of the pairs is fixed to the corresponding support member, and the other portion of the at least one electrode is supported movably in the thermal expansion direction by the corresponding support member.

12. A thin film formation apparatus as set forth in claim 9, wherein the plural pairs of the first and second electrodes are supported horizontally and perpendicularly to a gravity direction by the first and second support members.

* * * * *